United States Patent
Zhou

(10) Patent No.: US 10,069,509 B2
(45) Date of Patent: Sep. 4, 2018

(54) SIGMA DELTA MODULATOR AND SIGNAL CONVERSION METHOD THEREOF

(71) Applicant: Realtek Semiconductor Corporation, Hsinchu (TW)

(72) Inventor: Xiao-Bo Zhou, Jiangsu Province (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/693,450

(22) Filed: Aug. 31, 2017

(65) Prior Publication Data

US 2018/0159550 A1 Jun. 7, 2018

(30) Foreign Application Priority Data

Dec. 1, 2016 (CN) .......................... 2016 1 1092231

(51) Int. Cl.
H03M 3/00 (2006.01)
H03M 1/74 (2006.01)

(52) U.S. Cl.
CPC .............. *H03M 3/37* (2013.01); *H03M 1/742* (2013.01); *H03M 3/454* (2013.01); *H03M 3/464* (2013.01); *H03M 3/494* (2013.01)

(58) Field of Classification Search
None
See application file for complete search history.

(56) References Cited

U.S. PATENT DOCUMENTS

| 6,809,672 | B2 | 10/2004 | Gupta | |
|---|---|---|---|---|
| 7,852,249 | B2 * | 12/2010 | Oliaei | H03M 3/37 341/143 |
| 9,325,341 | B2 * | 4/2016 | Dagher | H03M 3/30 |
| 2010/0245147 | A1 * | 9/2010 | Souda | H03M 3/37 341/155 |
| 2014/0077984 | A1 * | 3/2014 | Shu | H03M 3/37 341/143 |

FOREIGN PATENT DOCUMENTS

CN 101917198 A 12/2010

OTHER PUBLICATIONS

James A. Cherry and W. Martin Snelgrove, "Excess Loop Delay in Continuous-Time Delta-Sigma Modulators," IEEE transactions on circuits and systems—II: Analog and Digital Signal Processing, vol. 46, No. 4, Apr. 1999.

* cited by examiner

*Primary Examiner* — Howard Williams
(74) *Attorney, Agent, or Firm* — CKC & Partners Co., Ltd.

(57) ABSTRACT

A sigma delta modulator includes a sigma delta modulating loop and a plurality of adjusting loops. The sigma delta modulating loop processes an input signal and an adjustment signal based on a first clock signal, so as to generate a quantized output signal. The first clock signal has a clock cycle. The sigma delta modulating loop has a first delay time that is the same as M times of the clock cycle. M is an integral multiple of 0.5 and is larger than 1. The adjusting loops delay the quantized output signal for second delay times, respectively, so as to generate the adjustment signal.

20 Claims, 3 Drawing Sheets

SIGMA DELTA MODULATOR AND SIGNAL CONVERSION METHOD THEREOF

RELATED APPLICATIONS

This application claims priority to China Application Serial Number 201611092231.5, filed Dec. 1, 2016, which is herein incorporated by reference.

BACKGROUND

Technical Field

The present disclosure relates to an integrated circuit. More particularly, the present disclosure relates to a sigma delta modulator with an adjusting loop delay mechanism and a signal conversion method thereof.

Description of Related Art

Due to some characteristics, e.g., noise shaping, sigma delta modulators are often applied to analog-to-digital converters with high resolution. However, with the increase of frequencies of clock signals and operating speeds of integrated circuits, errors are introduced due to the excess loop delays in the sigma delta modulators when the sigma delta modulators sample input signals. As a result, the accuracy of the final output data is reduced.

SUMMARY

One embodiment of the present disclosure is related to a sigma delta modulator. The sigma delta modulator includes a sigma delta modulating loop and a plurality of adjusting loops. The sigma delta modulating loop processes an input signal and an adjustment signal based on a first clock signal, so as to generate a quantized output signal. The first clock signal has a clock cycle. The sigma delta modulating loop has a first delay time that is the same as M times of the clock cycle. M is an integral multiple of 0.5 and is larger than 1. The adjusting loops delay the quantized output signal for a plurality of second delay times, respectively, so as to generate the adjustment signal.

Another embodiment of the present disclosure is related to a signal conversion method. The signal conversion method includes: processing an input signal and an adjustment signal based on a first clock signal by a sigma delta modulating loop, so as to generate a quantized output signal; and delaying the quantized output signal for a plurality of second delay times, respectively, so as to generate the adjustment signal. The first clock signal has a clock cycle. The sigma delta modulating loop has a first delay time that is the same as M times of the clock cycle. M is an integral multiple of 0.5 and is larger than 1.

As the above embodiments, the sigma delta modulator and the signal conversion method of the present disclosure can reduce the effects resulting from the excess loop delays by multiple adjusting loops.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure. Moreover, the drawings are for the purpose of illustration only, and are not in accordance with the size of the original drawing. The components in description are described with the same number to understand.

Although the terms "first," "second," etc., may be used herein to describe various elements, these elements should not be limited by these terms. These terms are used to distinguish one element from another.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

In addition, in this document, the term "coupled" may also be termed as "electrically coupled," and the term "connected" may be termed as "electrically connected". "Coupled" and "connected" may also be used to indicate that two or more elements cooperate or interact with each other.

Figure 1:
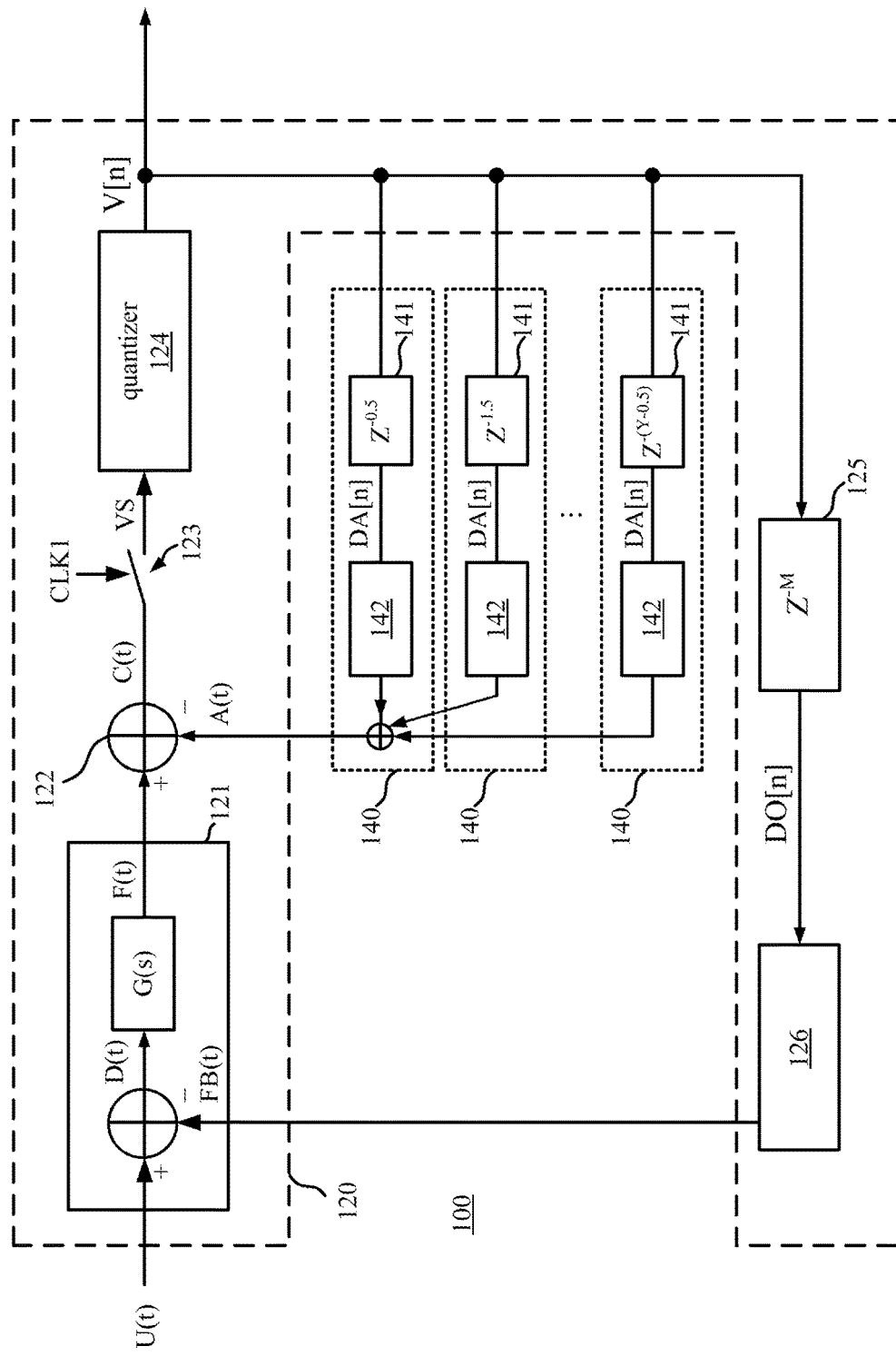
FIG. 1 is a schematic diagram illustrating a sigma delta modulator according to some embodiments of the present disclosure.

Reference is now made to FIG. 1. FIG. 1 is a schematic diagram illustrating a sigma delta modulator 100 according to some embodiments of the present disclosure. In some embodiments, the sigma delta modulator 100 is a continuous-time sigma delta modulator.

The sigma delta modulator 100 includes a sigma delta modulating loop 120 and adjusting loops 140. M is an integral multiple of 0.5 and is larger than 1. The sigma delta modulating loop 120 is configured to convert an input signal U(t) into a quantized output signal V[n] based on a clock signal CLK1. In some embodiments, the sigma delta modulating loop 120 includes a loop filter 121, a calculation circuit 122, a sampling circuit 123, a quantizer 124, a delay circuit 125, and a digital-to-analog converter 126.

The loop filter 121 is configured to generate a difference signal D(t) based on the input signal U(t) and a feedback signal FB(t), and filter the difference signal D(t), so as to generate an analog signal F(t). In some embodiments, the loop filter 121 may be implemented with one or more integrators. In some embodiments, the loop filter 121 may be implemented with one or more resonant circuits. For ease of understanding, "G(s)" in FIG. 1 is configured to represent gains of the aforementioned integrators or resonant circuits.

The aforementioned implementations of the loop filter 121 are given for illustrative purposes only, and the present disclosure is not limited thereto.

The calculation circuit 122 is coupled to the loop filter 121 and the adjusting loops 140, so as to receive the analog signal F(t) and the adjustment signal A(t). The calculation circuit 122 is configured to subtract the adjustment signal A(t) from the analog signal F(t), so as to generate a calculation signal C(t). In some embodiments, the calculation circuit 122 may be implemented with an adder circuit.

The sampling circuit 123 is coupled to the calculation circuit 122 to sample the calculation signal C(t) based on the clock signal CLK1, so as to generate a sampled signal VS. In some embodiments, the sampling circuit 123 may be implemented with a switch capacitor circuit. A switch of the switch capacitor circuit is turned on according to the clock signal CLK1 to store a signal value of the calculation signal C(t) into a capacitor of the switch capacitor circuit, so as to generate the sampled signal VS. The aforementioned implementations of the sampling circuit 123 are given for illustrative purposes only, and the present disclosure is not limited thereto.

The quantizer 124 is coupled to the sampling circuit 123 to receive the sampled signal VS. The quantizer 124 is configured to convert the sampled signal VS into a discrete quantized output signal V[n]. In some embodiments, the quantizer 124 may be implemented with one or more comparators, and is configured to compare the sampled signal VS and a reference voltage level to generate the quantized output signal V[n]. The aforementioned implementations of the quantizer 124 are given for illustrative purposes only, and the present disclosure is not limited thereto.

Figure 2A:
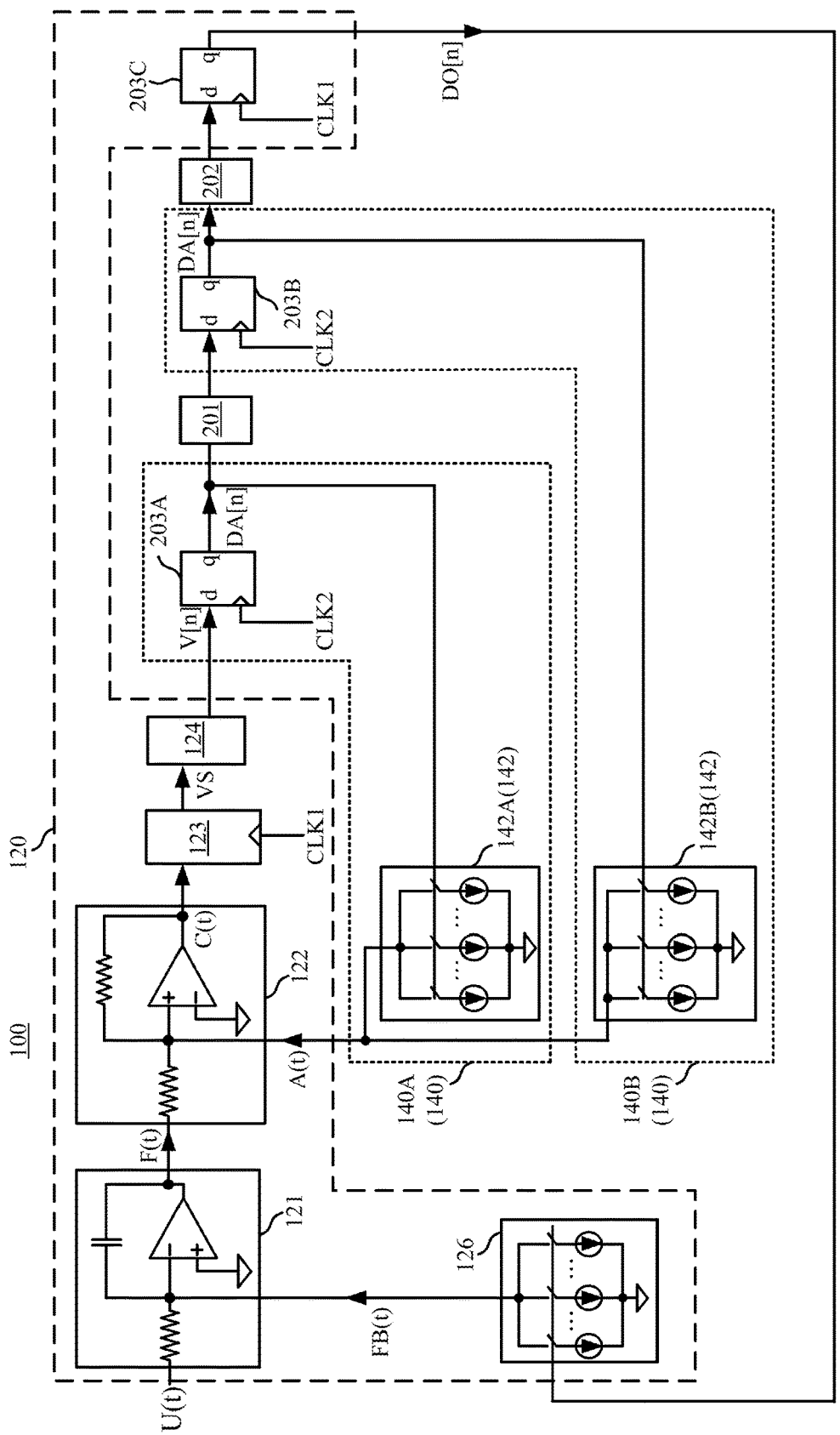
FIG. 2A is a circuit diagram illustrating the sigma delta modulator shown in FIG. 1 according to some embodiments of the present disclosure.
Figures 2B, 3:
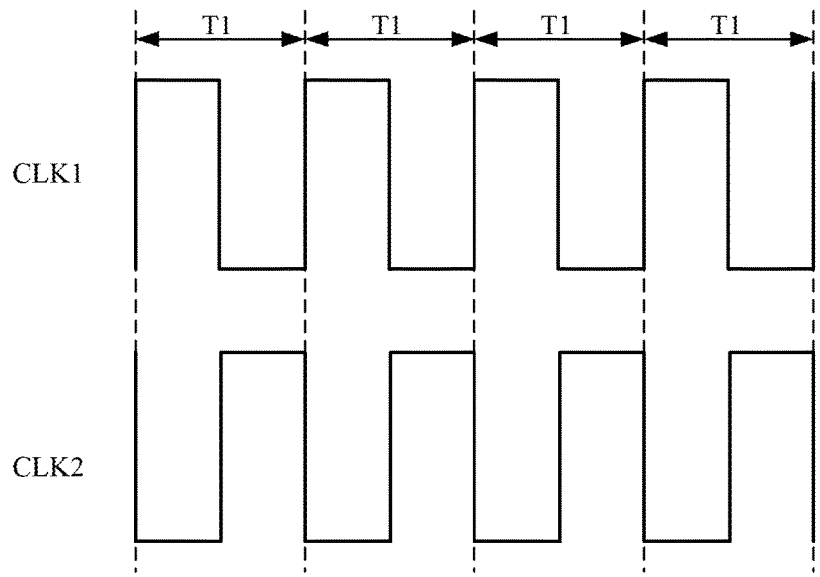
FIG. 2B is a waveform diagram illustrating clock signals shown in FIG. 2A according to some embodiments of the present disclosure.
FIG. 3 is a flow chart of illustrating a signal conversion method according to some embodiments of the present disclosure.

The delay circuit 125 is coupled to the quantizer 124, so as to receive the quantized output signal V[n]. In some embodiments, the clock signal CLK1 has a clock cycle T1 (as shown in FIG. 2B). The delay circuit 125 is configured to delay the quantized output signal V[n] for a time that is the same as M times of the clock cycle T1, so as to generate a delay output signal DO[n]. "$Z^{-M}$" in FIG. 1 represents a delay time that is equal to M times of the clock cycle T1. As described above, M is an integral multiple of 0.5 and is larger than 1. In some embodiments, with the arrangements of the delay circuit 125, the sigma delta modulating loop 120 has a delay time that is equal to M times of the clock cycle T1. The delay time is a time in which the quantizer 124 and digital logic circuits (for example, circuits 201 and 202 in FIG. 2A) can operate.

The digital-to-analog converter 126 is coupled to the delay circuit 125, so as to receive the delay output signal DO[n]. The digital-to-analog converter 126 is configured to convert the delay output signal DO[n] into the feedback signal FB(t).

In some embodiments, signal transmitting paths of the adjusting loops 140 are without the loop filter 121. Compared to the sigma delta modulating loop 120, each one of the adjusting loops 140 is coupled, in parallel, between the calculation circuit 122 and an output of the quantizer 124. In some embodiments, the number of the adjusting loops 140 is larger than or is equal to M. The adjusting loops 140 are configured to delay the quantized output signal V[n] for delay times respectively, so as to generate the adjustment signal A(t). In some embodiments, as illustratively shown in FIG. 1, the delay times are the same as 0.5 to |Y−0.5| times of the clock cycle T1 respectively. Effectively, there are Y adjusting loops 140, and Y is a positive integer that is larger than or equal to M.

In some embodiments, the Y delay times are different from each other by N clock cycle(s) T1, and N is a positive integer that is larger than or equal to 1. For example, a first adjusting loop 140 is configured to delay a half of clock cycle T1, and a second adjusting loop 140 is configured to delay 1.5 clock cycles T1. Thus, the aforementioned two delay times are different by one clock cycle T1 (i.e., N=1). For another example, the first adjusting loop 140 is configured to delay a half of the clock cycle T1, and a third adjusting loop 140 is configured to delay 2.5 clock cycles T1. Thus, the aforementioned two delay times are different by two clock cycles T1 (i.e., N=2).

In some embodiments, each one of the Y adjusting loops 140 includes a delay circuit 141 and a digital-to-analog converter 142. The delay circuits 141 are configured to delay the quantized output signal V[n] for a corresponding delay time respectively, so as to generate delay adjustment signals DA[n]. For example, as illustratively shown in FIG. 1, "$Z^{-0.5}$" to "$Z^{-(Y-0.5)}$" represent the delay times from a half of the clock cycle T1 to |Y−0.5| times of the clock cycle T1.

The digital-to-analog converters 142 are configured to convert the delay adjustment signals DA[n], so as to generate the adjustment signal A(t). In some embodiments, delay circuit 141 and the delay circuit 125 may be implemented with one or more digital circuits. In some embodiments, the one or more digital circuits include digital logic circuits, buffers, or flip-flops, but the present disclosure is not limited thereto. In some embodiments, the aforementioned one or more digital circuits may be implemented with a pipelined circuit configuration in the sigma delta modulator 100, so as to sequentially introduce required delay times.

In some embodiments, the digital-to-analog converters 126 and 142 may be implemented with current mode digital-to-analog converters. Thus, the input signal U(t) and the feedback signal FB(t) may be directly combined in the form of current signals (as shown in FIG. 2A below), and be input to the loop filter 121. Correspondingly, outputs of the digital-to-analog converters 142 may be directly combined in the form of current signals (as shown in FIG. 2A below), so as to generate the adjustment signal A(t). In some embodiments, the digital-to-analog converters 126 and 142 may be integrated into one digital-to analog converter.

The aforementioned implementations of the digital-to-analog converters 126 and 142 are given for illustrative purposes only. Various implementations of the digital-to-analog converters 126 and 142 are within the contemplated scope of the present disclosure.

In some related technologies, a delay time that is the same as a half of the clock cycle T1 is introduced into the calculation circuit 122, and a delay time that is the same as the clock cycle T1 is introduced into the loop filter 121, so as to reduce effects resulting from the excess loop delays of the sigma delta modulator. In these technologies, the sigma delta modulator only tolerates the excess loop time delay that is the same as one time cycle T1 at the most. However, with a sampling frequency (i.e., a frequency of the clock signal CLK1) becomes higher, the excess loop time delay has been more than one clock cycle T1. Thus, these technologies fail.

Compared to aforementioned arrangements, with the arrangements of Y adjusting loops 140, larger delay times can be introduced into the sigma delta modulator 100. Thus, the sigma delta modulator 100 can tolerate a delay time that is the same as one or more clock cycles T1. Thus, the quantizer 124 and related digital circuits can have sufficient operation time, so as to ensure a data conversion accuracy of the sigma delta modulator 100.

Reference is now made to FIG. 2A. FIG. 2A is a circuit diagram illustrating the sigma delta modulator 100 shown in FIG. 1 according to some embodiments of the present disclosure. For ease of understanding, with respect to the embodiments of FIG. 1, like steps in FIG. 2A are designated with the same reference numbers.

As an example of FIG. 2A, M is set to be as 2, the loop filter 121 includes an integrator, and the calculation circuit 122 includes an analog adder. Compared to FIG. 1, the sigma delta modulator 100 in FIG. 2A further includes digital logic circuits 201-202 and flip-flops 203A, 203B, and 203C.

The digital logic circuits 201-202 are arranged, with a pipelined configuration, in the sigma delta modulator 100. In some embodiments, the digital logic circuits 201-202 are configured to process the quantized output signal V[n], so as to effectively increase the linearity of the digital-to-analog converters 126 and 142. For example, the logic circuits 201-202 may be implemented with data weighted averaging circuits, dynamic element matching circuits, etc. The aforementioned implementations of the digital logic circuits 201-202 are given for illustrative purposes only, and the present disclosure is not limited thereto.

Reference is now made to FIG. 2B. FIG. 2B is a waveform diagram illustrating the clock signals CLK1 and CLK 2 shown in FIG. 2A according to some embodiments of the present disclosure. In some embodiments, the clock signals CLK1 and CLK2 are different in phase by about 180 degrees. The sampling circuit 123 is configured to sample the calculation signal C(t) at rising edges of the clock signal CLK1, so as to generate the sampled signal VS. The flip-flops 203A and 203B are configured to sample values of an output of the quantizer 124 and an output of the digital logic circuit 201, respectively, at rising edges of the clock signal CLK2 (i.e., falling edges of the clock signal CLK1), so as to output the delay adjustment signals DA[n]. The flip-flop 203C is configured to sample values of an output of the digital logic circuit 202 at the rising edges of the clock signal CLK1, so as to output the delay output signal DO[n]. The digital-to-analog converters 142 of the adjusting loops 140 is further configured to generate the adjustment signal A(t) based on the delay adjustment signals DA[n].

As illustratively shown in FIG. 2A, the digital-to-analog converters 126 and 142 are implemented with current mode circuits. The input signal U(t) and the feedback signal FB(t) are input to the loop filter 121 in a manner of a summation of currents, so as to generate the analog signal F(t). The analog signal F(t) and the adjustment signal A(t) are also input to the calculation circuit 122 in the manner of the summation of currents, so as to generate the calculation signal C(t). The calculation signal C(t) is sampled at the rising edges of the clock signal CLK1, so as to generate the sampled signal VS. Accordingly, the quantizer 124 can generate the quantized output signal V[n] based on the sampled signal VS.

Then, the first flip-flop 203A outputs the delay adjustment signal DA[n] to the digital-to-analog converter 142A and the digital logic circuit 201 at a rising edge of the clock signal CLK2. The rising edge of the clock signal CLK2 is corresponding to a half of the clock cycle T1 of the clock signal CLK1. Effectively, with the arrangements of the flip-flops 203A and 203B, the quantized output signal V[n] is delayed for a half of the clock cycle T1, so as to output the delay adjustment signal DA[n] transmitted to the digital-to-analog converter 142A.

Then, after one clock cycle T1, the second flip-flop 203B transmits another delay adjustment signal DA[n] to the digital-to-analog converter 142B and the digital logic circuit 202 at a rising edge of the clock signal CLK2. Effectively, with the arrangements of the flip-flops 203A and 203B, the quantized output signal V[n] is delayed 1.5 clock cycle T1, so as to output the delay adjustment signal DA[n] transmitted to the digital-to-analog converter 142B.

Then, after a half of the clock cycle T1, the third flip-flop 203C transmits the delay output signal DO[n] to the digital-to-analog converter 126 at a rising edge of the clock signal CLK 1. Thus, the digital-to-analog converter 126 can generate the feedback signal FB(t) based on the delay output signal DO[n]. Effectively, the quantized output signal V[n] is delayed for 2 times of the clock cycle T1, by the flip-flops 203A, 203B, and 203C, so as to be output as the delay output signal DO[n].

With the aforementioned arrangements, the quantizer 124 can have an operation time that is the same as a half of the clock cycle T1, the digital logic circuit 201 can have an operation time that is the same as one clock cycle T1, and the digital logic circuit 202 can have an operation time that is the same as a half of the clock cycle T1. Thus, the sigma delta modulator 100 in FIG. 2A has a total operation time that is the same as 2 times of the clock cycle T1. Compared to aforementioned related technologies, the sigma delta modulator 100 can tolerate more excess loop delays.

For ease of understanding, the aforementioned operations are only described with reference to the rising edges of the clock signal CLK1 and CLK2, but the present disclosure is not limited thereto. For example, in some other embodiments, the aforementioned operations can be performed based on other transition edges (for example, falling edges) of the clock signal CLK1 and CLK2. The implementations of the aforementioned delay times are given for illustrative purposes only. Various implementations of the delay times are within the contemplated scope of the present disclosure.

Reference is now made to FIG. 3. FIG. 3 is a flow chart illustrating a signal conversion method 300 according to some embodiments of the present disclosure. For better understanding of the present disclosure, the related operations of the sigma delta modulator 100 are described with FIGS. 1-3. In some embodiments, the signal conversion method 300 includes operations S310 and S320.

In operation S310, the sigma delta modulating loop 120 processes the input signal U(t) and the adjustment signal A(t) based on the clock signal CLK1, so as to generate the quantized output signal V[n]. The sigma delta modulating loop 120 has the delay time that is the same as M times of the clock cycle T1. As described above, the sigma delta modulating loop 120 samples the calculation signal C(t) according to the clock signal CLK1, and converts the calculation signal C(t) as the quantized output signal V[n]. The calculation signal C(t) is generated according to the input signal U(t).

In operation S320, the adjusting loops 140 introduces the delay times into the quantized output signal V[n], so as to generate the adjustment signal A(t). The delay times are 0.5 to |Y−0.5| times of the clock cycle T1 respectively. For example, as illustratively shown in FIG. 2A, in some embodiments, the quantized output signal V[n] can be delayed for a corresponding delay time (for example, a half of the clock cycle T1, 1.5 clock cycles T1, ... (Y−0.5) times of the clock cycle T1) respectively by one or more digital circuits (for example, the digital logic circuits 201-203 and the flip-flops 203A-203C), so as to generate the adjustment signal A(t).

The above description of the signal conversion method 300 includes exemplary operations, but the operations of the signal conversion method 300 are not necessarily performed in the order described. The operations of the signal conversion method 300 are able to be added, replaced, omitted, or performed with different orders, in accordance with the spirit and scope of various embodiments of the present disclosure.

For ease of understanding, the aforementioned embodiments are described with reference to that the adjusting loops 140 can delay 0.5 to |Y−0.5| times of the clock cycle T1 respectively, but the present disclosure is not limited thereto. In various embodiments, the delay times introduced into the adjusting loops 140 may be the same as Q to |Y−Q| times of the clock cycle T1 respectively. Q may be any decimal (for example, 0.4, 0.6, or other decimals).

As the above embodiments, the sigma delta modulator and the signal conversion method of the present disclosure can reduce the effects resulting from excess loop delays by multiple adjusting loops.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A sigma delta modulator, comprising:
a sigma delta modulating loop configured to process an input signal and an adjustment signal based on a first clock signal, so as to generate a quantized output signal, wherein the first clock signal has a clock cycle, the sigma delta modulating loop is configured to have a first delay time to compensate an excess loop delay associated with the sigma delta modulating loop, the first delay time is the same as M times of the clock cycle, and M is an integral multiple of 0.5 and is larger than 1; and
a plurality of adjusting loops configured to delay the quantized output signal for a plurality of second delay times, respectively, so as to generate the adjustment signal.

2. The sigma delta modulator of claim 1, wherein the sigma delta modulating loop comprises:
a loop filter configured to filter a difference signal, so as to generate an analog signal, wherein the difference signal is a difference between the input signal and a feedback signal;
a calculation circuit configured to subtract the adjustment signal from the analog signal, so as to generate a calculation signal;
a sampling circuit configured to sample the calculation signal according to the first clock signal, so as to generate a sampled signal;
a quantizer configured to convert the sampled signal into the quantized output signal;
a first delay circuit configured to delay the quantized output signal for the first delay time, so as to generate a delay output signal; and
a digital-to-analog converter configured to convert the delay output signal into the feedback signal.

3. The sigma delta modulator of claim 2, wherein the adjusting loops are coupled, in parallel, between the calculation circuit and the quantizer.

4. The sigma delta modulator of claim 2, wherein a plurality of signal transmitting paths of the adjusting loops are without the loop filter.

5. The sigma delta modulator of claim 2, wherein each one of the adjusting loops comprises:
a second delay circuit configured to delay the quantized output signal for a corresponding second delay time, so as to generate a delay adjustment signal; and
a second digital-to-analog converter configured to convert the delay adjustment signal, so as to generate the adjustment signal.

6. The sigma delta modulator of claim 5, wherein the first delay circuit and the second delay circuit are implemented with a plurality of digital circuits, and the digital circuits are arranged, with a pipelined circuit configuration, in the sigma delta modulating loop and the adjusting loops.

7. The sigma delta modulator of claim 1, wherein the sigma delta modulating loop is configured to process the input signal and the adjustment signal based on a transition edge of the first clock signal, so as to generate the quantized output signal.

8. The sigma delta modulator of claim 7, wherein the adjusting loops comprise:
a first adjusting loop comprising a first flip-flop, wherein the first flip-flop is configured to generate a first delay adjustment signal based on a transition edge of a second clock signal and the quantized output signal, and the first clock signal and the second clock signal are different in phase by 180 degrees; and
a second adjusting loop comprising a second flip-flop, wherein the second flip-flop is configured to generate a second delay adjustment signal based on the transition edge of the second clock signal and the first delay adjustment signal,
wherein the first adjusting loop and the second adjusting loop are configured to generate the adjustment signal based on the first delay adjustment signal and the second delay adjustment signal.

9. The sigma delta modulator of claim 8, wherein the sigma delta modulating loop comprises:
a third flip-flop configured to generate a delay output signal based on the transition edge of the first clock signal and the second delay adjustment signal,
wherein the sigma delta modulating loop is further configured to generate a feedback signal according to the delay output signal, so as to process the input signal.

10. The sigma delta modulator of claim 1, wherein the second delay times are the same as 0.5−|Y−0.5| times of the clock cycle respectively, and Y is a positive integer that is larger than or equal to M.

11. The sigma delta modulator of claim 1, wherein the second delay times are different from each other by N times of the clock cycle, and N is a positive integer that is larger than or equal to 1.

12. A signal conversion method, comprising:
processing an input signal and an adjustment signal based on a first clock signal by a sigma delta modulating loop, so as to generate a quantized output signal, wherein the first clock signal has a clock cycle, the sigma delta modulating loop is configured to have a first delay time to compensate an excess loop delay associated with the sigma delta modulating loop, the first delay time is the same as M times of the clock cycle, and M is an integral multiple of 0.5 and is larger than 1; and delaying the quantized output signal for a plurality of second delay times, respectively, so as to generate the adjustment signal.

13. The signal conversion method of claim 12, wherein the second delay times are the same as 0.5−|Y−0.5| times of the clock cycle respectively, and Y is a positive integer that is larger than or equal to M.

14. The signal conversion method of claim 12, wherein generating the quantized output signal comprises:
   filtering a difference signal to generate an analog signal, wherein the difference signal is a difference between the input signal and a feedback signal;
   subtracting the adjustment signal from the analog signal, so as to generate a calculation signal;
   sampling the calculation signal according to the first clock signal, so as to generate a sampled signal;
   converting the sampled signal into the quantized output signal;
   delaying the quantized output signal for the first delay time, so as to generate a delay output signal; and
   generating the feedback signal based on the delay output signal.

15. The signal conversion method of claim 14, wherein the second delay times are generated by a plurality of adjusting loops, the adjusting loops are coupled, in parallel, between a calculation circuit of the sigma delta modulating loop and a quantizer of the sigma delta modulating loop, the calculation circuit is configured to generate the calculation signal, and the quantizer is configured to generate the quantized output signal.

16. The signal conversion method of claim 12, further comprising:
   generating the first delay time and the second delay times by a plurality of digital circuits, wherein the digital circuits are arranged with a pipelined circuit configuration.

17. The signal conversion method of claim 12, wherein generating the adjustment signal comprises:
   delaying the quantized output signal for the second delay times, so as to generate a plurality of delay adjustment signals; and
   converting the delay adjustment signals, so as to generate the adjustment signal.

18. The signal conversion method of claim 12, wherein generating the quantized output signal comprises:
   processing the input signal and the adjustment signal based on a transition edge of the first clock signal, so as to generate the quantized output signal, and
   wherein generating the adjustment signal comprises:
      generating a first delay adjustment signal based on a transition edge of a second clock signal and the quantized output signal, wherein the first clock signal and the second clock signal are different in phase by 180 degrees;
      generating a second delay adjustment signal based on the transition edge of the second clock signal and the first delay adjustment signal; and
      generating the adjustment signal based on the first delay adjustment signal and the second delay adjustment signal.

19. The signal conversion method of claim 18, wherein generating the quantized output signal comprises:
   generating a delay output signal based on the transition edge of the first clock signal and the second delay adjustment signal; and
   generating a feedback signal according to the delay output signal, so as to process the input signal.

20. A sigma delta modulator, comprising:
   a sigma delta modulating loop configured to process an input signal and an adjustment signal based on a first clock signal, so as to generate a quantized output signal, wherein the first clock signal has a clock cycle, the sigma delta modulating loop is configured to have a first delay time that is the same as M times of the clock cycle, and M is an integral multiple of 0.5 and is larger than 1; and
   a plurality of adjusting loops configured to delay the quantized output signal for a plurality of second delay times, respectively, so as to generate the adjustment signal, wherein the adjusting loops comprise:
      a first adjusting loop comprising a first flip-flop, wherein the first flip-flop is configured to generate a first delay adjustment signal based on a transition edge of a second clock signal and the quantized output signal, and the first clock signal and the second clock signal are different in phase by 180 degrees; and
      a second adjusting loop comprising a second flip-flop, wherein the second flip-flop is configured to generate a second delay adjustment signal based on the transition edge of the second clock signal and the first delay adjustment signal, wherein the first adjusting loop and the second adjusting loop are configured to generate the adjustment signal based on the first delay adjustment signal and the second delay adjustment signal, and
   wherein the sigma delta modulating loop comprises:
      a third flip-flop configured to generate a delay output signal based on a transition edge of the first clock signal and the second delay adjustment signal, wherein the sigma delta modulating loop is further configured to generate a feedback signal according to the delay output signal, so as to process the input signal.

* * * * *